METHOD OF DETERMINING THE CONCENTRATION OF ACTIVE IMPURITIES PRESENT IN A GASEOUS DECOMPOSABLE SEMI CONDUCTOR COMPOUND

Original Filed Dec. 6, 1960

3,233,174

METHOD OF DETERMINING THE CONCENTRATION OF ACTIVE IMPURITIES PRESENT IN A GASEOUS DECOMPOSABLE SEMICONDUCTOR COMPOUND

William J. McAleer, Madison Township, Middlesex County, and Peter I. Pollak, Scotch Plains, N.J., assignors to Merck & Co., Inc., Rahway, N.J., a corporation of New Jersey Original application Dec. 6, 1960, Ser. No. 74,111. Divided and this application Nov. 30, 1961, Ser. No. 163,006
2 Claims. (Cl. 324—65)

This invention is a divisional of Serial No. 74,111, filed December 6, 1960, now abandoned and relates to planar junction single crystal semiconductor bodies and, more particularly, to a method of making said bodies in a high degree of crystalline perfection by depositing from the vapor phase onto a single crystal of predetermined conductivity type and degree which is crystallographically oriented with a low order Miller indices surface exposed to the vapor. As another aspect of the instant invention, it also relates to a method of determining the concentration of the impurities of the semiconductor vapor.

As will be appreciated by those skilled in the art, it is extremely desirable to provide clearly defined planar junctions within single crystal semiconductor bodies. Furthermore, the art will appreciate that it is also desirable to effect production of a plurality of such bodies simultaneously under such conditions wherein a predetermined impurity distribution profile is established in the single crystal. It is also known that techniques of forming a planar junction within a semiconductor body which involve alloying or diffusion of the impurity atoms into the semiconductor body have decided limitations in regard to the sought-after objectives enumerated above. While it is commonly believed that growth of junctions from the vapor phase offers the best possible approach to the solution of the problem of obtaining economical, reliable junction devices, it has been an object of considerable research to provide operative processes for obtaining such junction devices in a high degree of crystalline perfection.

Accordingly, it is an object of the present invention to provide a vapor growth method by which planar junction semiconductor devices may be readily formed.

It is another object of the present invention to provide a method of growing single crystal junction semiconductor bodies having a substantially planar junction region therein.

A further object of the instant invention is to provide a method of forming a planar, a single crystal silicon junction semiconductor body wherein deposition is effected onto a single crystal silicon semiconductor material which has at least one planar surface which conforms to a predetermined low order Miller indices plane.

Still another object of this invention is to provide broad area P-N junctions within a silicon semiconductor crystal which may be readily divided to provide a number of uniform semiconductor devices all of which have substantially the same operating characteristics.

Among the other objects of the invention is to provide a method of determining the concentration of active impurities present in a decomposable semiconductor vapor wherein the concentration of said active impurities is manifested by the conductivity type and degree of semiconductor material formed by decomposing the compound containing said impurities onto a substrate crystal.

These and other objects in the invention will be apparent from consideration of this disclosure in conjunction with the accompanying drawings, wherein.

Figure 1:
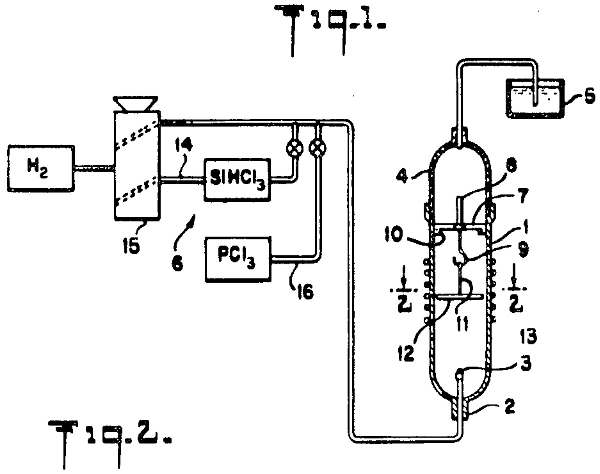
FIGURE 1 is a highly schematic illustration of a suitable apparatus for carrying out the method of the present invention.

In accordance with the preferred form of the present invention, there is provided a method of forming a planar, single crystal silicon semiconductor body having layers of single crystal silicon semiconductor material having different conductivities and separated by a junction or transition region which includes providing a single crystal of silicon semiconductor material having at least one planar surface conforming to a predetermined low order Miller indices crystallographic plane and having a defined conductivity, thereafter contacting the crystal with a vapor including a decomposable compound containing silicon semiconductor atoms and active impurities therefor in amount and type sufficient to impart a second predetermined conductivity type and degree in the semiconductor atoms and finally effecting deposition of the atoms and active impurities therefor to form on the surface of the crystals a single crystal layer of silicon semiconductor material which provides a substantially planar transition region between the substrate and deposited layer.

As another aspect of the present invention, there is also provided a method of determining the concentration of active impurities present in the vapor of a decomposable semiconductor compound wherein the concentration of the active impurity is manifested by the conductivity type and degree of semiconductor material formed by decomposing the compound containing the impurities. The method includes first contacting a substrate of single crystal semiconductor material of a predetermined conductivity type and degree with a vapor of the decomposable semiconductor compound containing the impurities to form thereby a layer of impurity containing semiconductor material overlying the substrate on the surface thereof, thereafter measuring the conductivity type and degree of the deposited material and finally calculating the concentration present in the semiconductor vapor using the measured value directly from a standard plot of impurity concentration versus resistivity.

Still another broad feature of the present invention is the provision of a single crystal semiconductor body including a planar substrate of monocrystalline semiconductor material of a predetermined conductivity type and degree having a surface conforming to a predetermined low order Miller indices crystallographic plane and a layer of semiconductor material overlying the substrate on the surface thereof, which layer comprises a mixture of in situ deposited atoms of the semiconductor material and active impurities thereof, the active impurities being present in the deposited layer in amounts sufficient to impart a second predetermined conductivity type and degree, thereby forming a planar transition region between the substrate and the deposited layer.

The terms "thermally decomposable," "thermal decomposition" and the associated deposit of a product of decomposition, as used herein, are intended to be generic to the mechanisms of heat-cracking as, for example, the decomposition of silicochloroform and silicon tetrachloride and liberation of silicon atoms through the action of heat alone and the mechanism of high temperature reactions wherein the high temperature causes interaction between various materials with liberation of specific materials or atoms as, for example, the reaction of $$3SiHCl_3+H_2\rightarrow 2Si+SiCl_4+5HCl$$

used in the preferred embodiments of this invention, as hereinafter indicated. For the sake of illustration, the following detailed description of apparatus used in product obtained relates to the use of the invention in the formation of single crystal silicon semiconductor bodies.

The term "active impurities" is used herein in its meaning commonly understood by those skilled in the art, namely, materials which are capable of imparting activating characteristics to a semiconductor material including those of the "donor" type, such as phosphorus, antimony, or arsenic and those of the "acceptor" type such as boron, gallium, aluminum or indium.

Referring now to FIGURE 1, there is shown in schematic form a suitable apparatus for carrying out the method of the present invention. As will be appreciated by the art, the apparatus shown is highly illustrative and the dimensions and specifications presented may be varied widely in accordance with sound engineering practice. The apparatus shown includes a quartz reaction tube 1 approximately 18 mm. in diameter and 30 cm. long. The bottom of the tube 2 serves as an inlet to admit gases through nozzle inlet 3. The reaction tube is fitted into a standard tapering quartz joint 4 which extends to an oil bath bubbler 5 through which gaseous materials are discharged into a fume hood. The gases are introduced into the bottom of the reaction tube through a vapor train, referred to generally as 6. The train is designed to admit vapors of a decomposable compound of silicon, such as silicochloroform, together with a carrier gas, such as hydrogen, into the reactor chamber.

Figure 2:
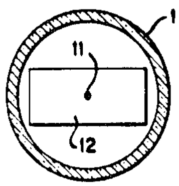
FIGURE 2 is a plane sectional view taken along lines 2—2 of FIGURE 1 showing a typical single crystal substrate as used herein.

The interior of the assembly to the reaction tube includes a quartz disc 7 provided with a handle 8 and a small hook 9. The disc is of a diameter large enough to rest on indentations 10 in the reaction tube inserted just below the quartz joint. Suspended from the hook is a thin quartz rod 11 upon which a single crystal substrate 12, shown in detail in FIGURE 2, hangs free of contact with the walls of the reaction vessel. The substrate is heated by an induction heating coil 13 positioned around the wall of the reaction vessel. In a preferred practice of the present invention, as will be described in detail hereinafter, the substrate 12 is preferably made of single crystal silicon which is crystallographically oriented with a planar surface of a low order Miller indices exposed to the vapors which enter the reaction tube. To effect RF coupling to high resistivity silicon, which does not couple at room temperature, the silicon crystal is heated to a red glow by warming the reactant wall immediately around the wafer with a hand torch burning a gas-oxygen mixture. As the silicon piece glows red, torch heating is discontinued and the RF coil around the silicon wafer is activated. Induction coupling occurs immediately and the wafer is brought to about 1150° C. using an optical pyrometer (not shown) to check the temperature.

Figure 3:
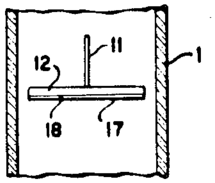
FIGURE 3 is a fragmental sectional view taken along lines 3—3 of FIGURE 2 in which is illustrated a typical semiconductor body formed in accordance with the method of the instant invention.

In operation, a stream of hydrogen is passed through first the reactor and then the vaporizer line 14 by means of a two-way stopcock 15 to insure removal of oxygen from the system. Thereafter, the substrate crystal is brought to the desired temperature and hydrogen flow is maintained for an additional half-hour through the reactor to effect an in situ etch of the substrate before deposition of silicon is begun. The hydrogen stream then is passed through the vaporizer line with the active impurity line 16 open carrying thereby silicochloroform and phosphorus trichloride into the reactor. The hydrogen flow rate is adjusted at 15 liters per minute and the silicochloroform is maintained at room temperature. The resulting mole ratio of silicochloroform to hydrogen which enters the reaction chamber is approximately 0.6. Vaporization is carried out for about 30 seconds. As shown in detail in FIGURE 3, upon contacting the heated, oriented planar substrate the silicochloroform and phosphorus trichloride decompose, depositing a single crystal layer of silicon semiconductor material 17 of a predetermined conductivity type and degree on the substrate crystal thereby forming a planar transition region 18 between the substrate and the deposited layer. Thereafter the reactor is prepared for another run by purging it of residual silicochloroform and active impurities by allowing pure hydrogen only to pass through the reactor. At the conclusion of the run, the RF generator is turned off and the support containing the deposited silicon is allowed to cool to room temperature in a stream of hydrogen.

In accordance with the preferred practice of the present invention, the substrate is prepared from single crystals of a defined type and degree which are cut from large crystals so that a planar surface conforming to a predetermined low order Miller indices crystallographic plane is exposed. The use of a low order Miller indices crystallographic plane provides rapid growth of the vapor deposited overlayer in the form of a uniform single crystal.

The oriented single crystal silicon substrate may be prepared in any suitable manner, as, for example, by slicing a wafer from commercially available zone defined single crystals of silicon semiconductor material. Preferred to low order Miller indices planes on which the desired growth will occur are the {110}, {111}, and {211} planes.

The surface of the substrate crystal is carefully prepared by the known techniques of lapping, polishing and etching. Specifically, the substarate may be etched in 30 ml. of a 50% potassium hydroxide solution for 5 minutes at 60° C. High resistivity water, about 60 megohm, is then poured into the beaker to produce a more dilute solution of about 3:1 concentration and the crystal is treated for an additional 15 minutes in this solution. Finally, the crystal is removed from the bath, washed copiously wtih high resistivity water, sprayed with reagent grade acetone and air dried.

Following the procedure described in detail above, planar, substrate oriented single crystal P-N junction bodies were fabricated using as a support a P-type silicon single crystal oriented with the {111} face exposed to the vapor. Specifically, a vapor of silicochloroform containing two parts per billion of $PCl_3$ was decomposed in the reactor chamber during 30 seconds to provide an overlayer of N-type single crystals of silicon with a planar P-N junction region therebetween.

In accordance with another feature of the instant invention, the resistivity and conductivity type of the deposited semiconductor layer was used to determine the concentration of active impurities in the gaseous semiconductor stream. In the table below there is summarized a series of experiments which established a standardized relationship between the concentration of the impurity in the vapor and the resistivity of the deposited layer of 0.5 mil thickness.

*Table*

| Charge | Resistivity (ohm. cm.) | Type |
|---|---|---|
| $SiHCl_3$+1 p.p.m. $PCl_3$ | 0.10 | N |
| $SiHCl_3$+100 p.p.b. $PCl_3$ | 0.60 | N |
| $SiHCl_3$+10 p.p.b. $PCl_3$ | 3.00 | N |
| $SiHCl_3$+1 p.p.b. $PCl_3$ | 50.00 | N |

Figure 4:
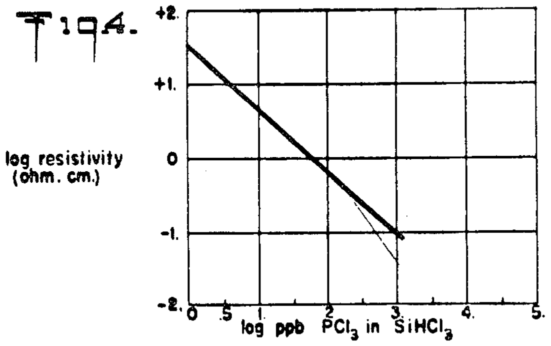
FIGURE 4 is a plot of the log of resistivity of deposited silicon layer versus log of the concentration of phosphorus trichloride in silicochloroform.

The surface area of the crystal upon which deposition occurred was 1.5 square centimeters. As shown in FIGURE 4, a plot of the log of the measured resistivity versus the log of the impurity concentration gives a straight line relationship. Accordingly, the concentration of impurity in an unknown semiconductor vapor may be determined directly from the slope of the curve using the measured resistivity values. In mathematical terms the concentration of impurities may be determined by the formula: log concentration impurities in parts per billion=−3.3 log of the measured resistivity in ohm cm.

The procedure outlined above for determining the concentration of impurities in a decomposable semiconductor vapor is advantageously used for controlling the concentration of impurities which enter the semiconductor overlayer as described previously.

What has been described herein is a method of forming a planar, single crystal semiconductor body which includes layers of single crystal semiconductor material having different conductivities and separated by a transition region which includes the step of depositing an overlayer of silicon with predetermined impurities therewith from the vapor phase onto a single crystal of semiconductor material which has a planar surface which conforms to a predetermined low order Miller indices crystallographic plane and which is of a defined conductivity. The process of the present invention provides an economical solution to the problem of growth of planar junctions from the vapor phase. Still more important, it enables the rapid fabrication of a plurality of junction devices in a high degree of crystalline perfection.

It will be appreciated that the foregoing description of this invention is detailed for the purposes of illustration but that the invention should not be considered limited to such detail and the scope of the invention should be construed only in accordance with the appended claims.

What is claimed is:

1. A method of determining the concentration of active impurities present in a gaseous decomposable semiconductor compound wherein the concentration of said active impurity manifests itself by the conductivity type and degree of semiconductor material formed by decomposing said compound containing said impurities comprising the steps of contacting a substrate of single crystal semiconductor material of a predetermined conductivity type and degree with said semiconductor compound containing said impurities to form thereby a layer of said semiconductor material containing said impurities overlying said substrate on the surface thereof, measuring the conductivity type and degree of said overlayer and calculating the concentration of said active impurities present in said semiconductor compound by the formula: log of the concentration of impurities in parts per billion=−3.3 log of the measured resistivity in ohm cm.

2. A method of determining the concentration of $PCl_3$ active impurities present in the gaseous decomposable semiconductor compound $SiHCl_3$ wherein the concentration of said active impurity manifests itself by the conductivity type and degree of silicon semiconductor material formed upon decomposing said compound containing said impurities comprising the steps of contacting a substrate of single crystal silicon semiconductor material of a predetermined conductivity type and degree with said semiconductor compounds containing said impurities to form thereby a layer of said silicon semiconductor material containing phosphorus impurities overlying said substrate on the surface thereof, measuring the conductivity type and degree of said overlayer and calculating the concentration of said $PCl_3$ active impurities present in said semiconductor compound by the formula: log concentration impurities in parts per billion=−3.3 log of the resistivity.

References Cited by the Examiner

UNITED STATES PATENTS

| | | | |
|---|---|---|---|
| 2,895,858 | 7/1959 | Sangter | 148—1.5 |
| 2,910,394 | 10/1959 | Scott et al. | 23—223.5 |
| 2,965,842 | 12/1960 | Jacobson | 73—23 |
| 2,975,362 | 3/1961 | Jacobson | 73—23 |
| 3,036,895 | 5/1962 | Cole. | |
| 3,039,053 | 6/1962 | Jacobson | 73—23 |
| 3,048,776 | 8/1962 | Logan | 324—62 |
| 3,089,794 | 5/1963 | Marinace | 148—1.5 |
| 3,099,579 | 7/1963 | Spitzer et al. | 117—230 |

FOREIGN PATENTS

| | | |
|---|---|---|
| 1,029,941 | 5/1958 | Germany. |

OTHER REFERENCES

Lark Horovitz: (Elec. Eng.) December 1949, pp. 1047–1054 (Conductivity in Semiconductors).

MORRIS O. WOLK, *Primary Examiner.*

JAMES H. TAYMAN, *Examiner.*